United States Patent
Clay, Jr. et al.

(10) Patent No.: US 10,425,559 B2
(45) Date of Patent: Sep. 24, 2019

(54) CORNER MOUNTED TIP-OFF TUBE FOR VACUUM PACKAGE

(71) Applicant: FLIR Systems, Inc., Wilsonville, OR (US)

(72) Inventors: Royce Duane Clay, Jr., Santa Barbara, CA (US); William Williamson, Orcutt, CA (US); Michael Nuttman, Goleta, CA (US)

(73) Assignee: FLIR SYSTEMS, INC., Wilsonville, OR (US)

( * ) Notice: Subject to any disclaimer, the term of this patent is extended or adjusted under 35 U.S.C. 154(b) by 675 days.

(21) Appl. No.: 15/177,185

(22) Filed: Jun. 8, 2016

(65) Prior Publication Data

US 2016/0366312 A1    Dec. 15, 2016

Related U.S. Application Data

(60) Provisional application No. 62/175,936, filed on Jun. 15, 2015.

(51) Int. Cl.

| | |
|---|---|
| *G01J 5/00* | (2006.01) |
| *H04N 5/225* | (2006.01) |
| *G01J 5/06* | (2006.01) |
| *B65D 6/00* | (2006.01) |
| *B65D 81/20* | (2006.01) |
| *H04N 5/33* | (2006.01) |
| *H05K 5/00* | (2006.01) |

(52) U.S. Cl.
CPC ......... *H04N 5/2252* (2013.01); *B65D 11/10* (2013.01); *B65D 81/2015* (2013.01); *G01J 5/061* (2013.01); *H04N 5/33* (2013.01); *H04N 5/332* (2013.01); *H05K 5/0095* (2013.01)

(58) Field of Classification Search
CPC ........ H04N 5/2252; H04N 5/33; H04N 5/332; H05K 5/0095; H01L 27/14618; H01L 27/16; B65D 11/10; B65D 81/2015; G01J 5/061; G01J 5/20; G01J 2005/062
See application file for complete search history.

(56) References Cited

U.S. PATENT DOCUMENTS

| | | |
|---|---|---|
| 4,919,291 A | 4/1990 | Romano et al. |
| 5,713,610 A | 2/1998 | Eneim et al. |
| 7,316,101 B1 | 1/2008 | Nguyen et al. |

(Continued)

FOREIGN PATENT DOCUMENTS

EP        0343229        4/1992

*Primary Examiner* — Kiho Kim
(74) *Attorney, Agent, or Firm* — Haynes and Boone, LLP

(57) ABSTRACT

Various embodiments of the present disclosure may include a device comprising a vacuum package housing. The vacuum package housing comprises a base and a plurality of walls connected to the base and defining an interior cavity adapted to receive a focal plane array, wherein at least two of the walls meet to define a corner of the vacuum package housing. The vacuum package housing further comprises an aperture formed at the corner, wherein the aperture extends through the at least two of the walls to provide a channel between the interior cavity of the vacuum package and an external environment, and wherein the aperture is adapted to receive a tip-off tube configured to be changed from an open state to a closed state to maintain a vacuum within the interior cavity.

20 Claims, 8 Drawing Sheets

(56) References Cited

U.S. PATENT DOCUMENTS

| | | |
|---|---|---|
| 7,818,948 B2 | 10/2010 | Cannon |
| 8,377,525 B2 | 2/2013 | Cooper et al. |
| 2005/0274892 A1* | 12/2005 | Oda ........................ G01J 5/061 |
| | | 250/339.04 |
| 2011/0114840 A1* | 5/2011 | Yamazaki ................. G01J 5/04 |
| | | 250/338.1 |
| 2012/0026337 A1* | 2/2012 | Boulanger .............. G01J 5/046 |
| | | 348/164 |

* cited by examiner

CORNER MOUNTED TIP-OFF TUBE FOR VACUUM PACKAGE

CROSS-REFERENCE TO RELATED APPLICATIONS

This application claims the benefit of and priority to U.S. Provisional Patent Application No. 62/175,936, filed Jun. 15, 2015, and entitled "CORNER MOUNTED TIP-OFF TUBE FOR VACUUM PACKAGE," which is incorporated herein by reference in its entirety.

TECHNICAL FIELD

One or more embodiments of the invention relate generally to vacuum sealed packages and more particularly, for example, to techniques for creating a vacuum within such packages.

BACKGROUND

Infrared imaging devices often include a vacuum package with various infrared detection components (e.g., a focal plane array and/or other detector devices) mounted therein. The vacuum package typically includes an opening allowing for a vacuum to be applied to the package. For example, an opening (e.g., an aperture) may be provided on substantially planar surfaces of the walls or bottom surfaces of the package. A tip-off tube is attached to the aperture and a vacuum pump. After a sufficient vacuum is applied, the tip-off tube is sealed to maintain the vacuum.

Unfortunately, such conventional approaches typically require a residual portion of the tip-off tube to stay attached to the vacuum package to maintain the vacuum seal. Such implementations can significantly increase the overall external dimensions of the resulting device. In this regard, the residual tip-off tube may protrude (e.g., extend) from the afore-mentioned planar surfaces of the walls or bottom surfaces of the package. Such protrusions may interfere with the ability to add other components in close proximity to the package, thus increasing the size of an infrared imaging device.

SUMMARY

An infrared imaging device may include a vacuum package, which may have a focal plane array disposed within a vacuum package housing and having backend electronics to receive and process thermal image data. For example, a wafer-level packaged (WLP) or pixel-level packaged (PLP) infrared sensor assembly may constitute one or a plurality of infrared sensors constituting the focal plane array. Additional supporting electronics, such as a read out integrated circuit (ROIC), may also be disposed with the focal plane array to receive thermal radiation data detected by the focal plane array In some embodiments, an infrared imaging device is constructed where the vacuum package housing includes a base and walls connected to the base. The walls may define an interior cavity and may meet (e.g., intersect or join) to define a corner of the vacuum package housing. For example, the vacuum package housing may be substantially rectangular or square, so that the vacuum package housing includes four corners, each where two of the walls meet. In order to provide a mechanism to apply a vacuum to the interior cavity of the vacuum package housing and maintain the vacuum package housing within the interior cavity, an aperture may be formed at one of the corners of the vacuum package housing.

The aperture may extend through the walls of the vacuum package housing through the corner so that the aperture provides a channel from the interior cavity to an external environment. The aperture may further be formed so that the aperture removes material of the walls at the corner, such as at a substantially 45 degree angle to the walls. For example, a recess may be made at the corner of the vacuum package housing that forms an indent structure or an inlet in the walls at the corner. The aperture may then be formed through the walls in the recess (e.g., in the middle of the recess) to open the interior cavity of the vacuum package housing to the external environment. A tip-off tube in an open state (e.g., a copper piping having an internal cavity and allowing flowthrough of matter, such as liquid and/or gas) may be connected to the aperture by, for example, soldering and/or other techniques. Later, once the package is ready to be vacuumed and sealed (e.g., once the focal plane array and supporting electronics are added to the interior cavity and a window is connected to the plurality of walls), the tip-off tube may be connected to a vacuum pump and a vacuum applied to the interior cavity by evacuating the interior cavity through the tip-off tube. In order to maintain the vacuum within the interior cavity, the tip-off tube may be sealed by applying, for example, a machine pinch to the tip-off tube nearby the package. The resulting vacuum package may have decreased size resulting from having an extension of the sealed tip-off tube (e.g., all or substantially all of the residual portion of the tip-off tube) be obscured by physical features of the aperture in the corner of the vacuum package housing.

In one embodiment, a device comprises a vacuum package housing. The vacuum package housing further comprises a base and a plurality of walls connected to the base and defining an interior cavity adapted to receive a focal plane array, wherein at least two of the walls meet to define a corner of the vacuum package housing. The vacuum package housing further comprises an aperture formed at the corner, wherein the aperture extends through the at least two of the walls to provide a channel between the interior cavity of the vacuum package and an external environment, and wherein the aperture is adapted to receive a tip-off tube adapted to be changed from an open state to a closed state to maintain a vacuum within the interior cavity.

In another embodiment, a method comprises providing a vacuum package housing comprising a base and a plurality of walls connected to the base, wherein the base and the walls define an interior cavity adapted to receive a focal plane array, and wherein at least two of the walls meet to define a corner of the vacuum package housing. The method further comprises forming an aperture at the corner of the vacuum package housing, wherein the aperture extends through the at least two of the walls to provide a channel between the interior cavity of the vacuum package and an external environment, and wherein the aperture is adapted to receive a tip-off tube adapted to be changed from an open state to a closed state to maintain a vacuum within the interior cavity.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
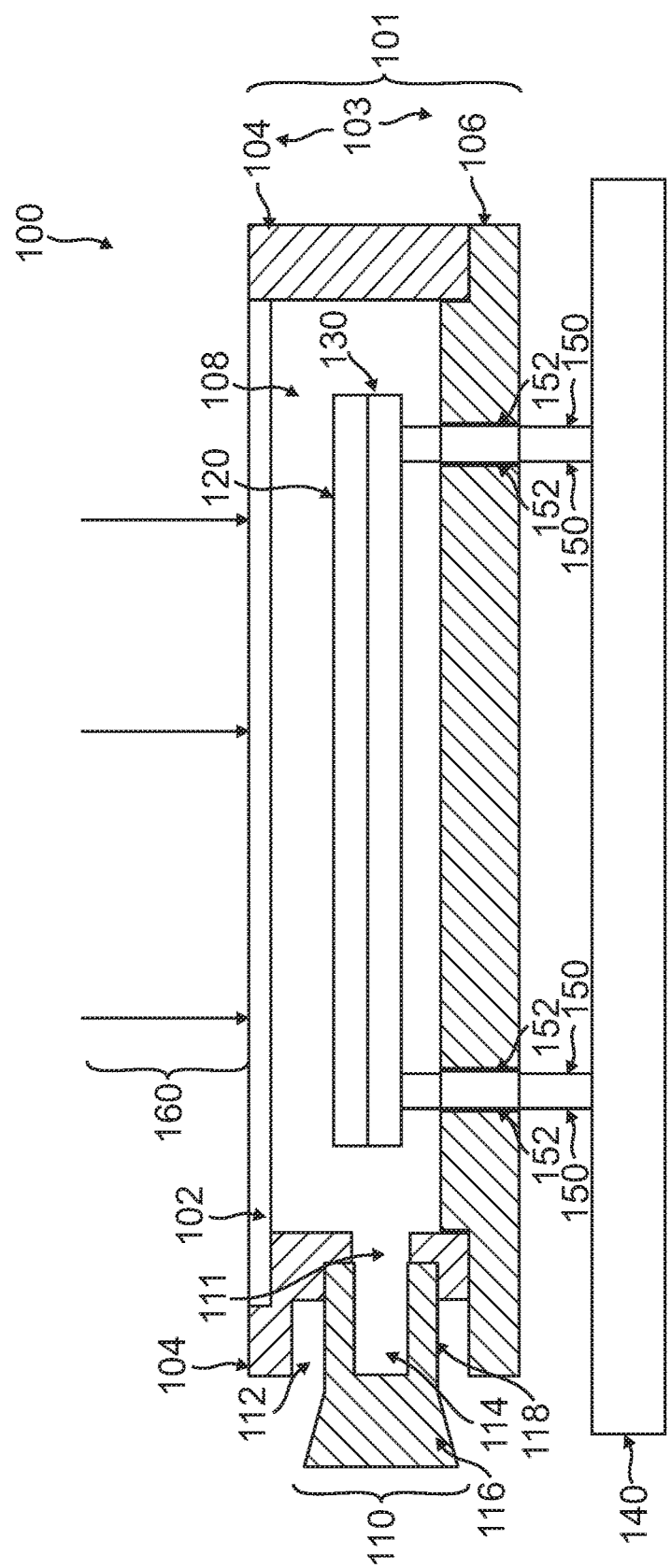
FIG. 1 illustrates a side cutaway view of a completed vacuum package including internal infrared imaging components in a sealed configuration, according to an embodiment.

FIG. 1 illustrates a side cutaway view of a completed vacuum package including internal infrared imaging components in a sealed vacuum, according to an embodiment. An imaging assembly 100 comprises, in one implementation, a vacuum package assembly 101 and additional electronics 140. The vacuum package assembly 101 may include a window 102, a vacuum package housing 103 formed by walls 104 and base 106, a focal plane array 120 (e.g., including a plurality of infrared detectors such as microbolometers and/or other detectors), supporting electronics 130 (e.g., a read out integrated circuit (ROIC) and/or other circuitry), and connecting pins 150 to the additional electronics 140 (e.g., one or more processors and/or other circuitry to receive and process thermal images captured by the focal plane array 120).

The imaging assembly 100 may be used to implement an imager of an infrared imaging system (e.g., part of a thermal camera) configured to capture and process thermal radiation 160 emitted from a scene in an external environment. The imaging assembly 100 may be a component of any type of infrared camera adapted to detect infrared radiation and provide representative data and information (e.g., thermal infrared image data of a scene). For example, the imaging assembly 100 may be included in an infrared camera that is directed to the near, middle, and/or far infrared spectrums. In another example, the infrared image data may comprise non-uniform data (e.g., real image data that is not from a shutter or black body) of the thermal radiation 160, for processing. The imaging assembly 100 may comprise a portable device and may be incorporated, e.g., into a vehicle (e.g., an automobile or other type of land-based vehicle, an aircraft, or a spacecraft) or a non-mobile installation requiring infrared images to be stored and/or displayed.

The vacuum package assembly 101 may include a vacuum package housing 103 formed by the walls 104 connected to the base 106. In various embodiments, the walls 104 and the base 106 may be an integrated structure such that the walls 104 and the base 106 are machined from a single block of material to form an interior cavity 108. The interior cavity 108 may also be formed by attaching two or more separate structures as the walls 104 and the base 106 using appropriate materials to connect the separate structures, including adhesive, screws, pins, or other materials. The interior cavity 108 may correspond to a recessed compartment within the vacuum package housing 103 defined by the walls 104 and the base 106 as boundary surfaces of the interior cavity 108. In some embodiments, the vacuum package housing 103 may be a substantially rectangular or square structure as illustrated, however other shapes are also contemplated.

The vacuum package housing 103 may be formed from various materials as appropriate for particular applications. In some embodiments, an iron-nickel-cobalt alloy material (e.g., such as Kovar) may be used. In some embodiments, a stainless steel material (e.g., 304L low carbon stainless steel) may be used.

A corner 110 (e.g., also referred to as a corner region or corner area) may be formed at the meeting of two of the walls 104. For example, at least two of the walls 104 may meet to form the corner 110, which may correspond to an intersection or joint of the vacuum package housing 103 in some embodiments. Where the vacuum package housing 103 forms a substantially rectangular or square structure, the corner 110 may correspond to a substantially right angle edge of the package where two of the walls 104 intersect when substantially perpendicular to each other. However, other formations of the vacuum package housing 103 may include greater or fewer numbers of such intersections and/or different configurations of corner 110.

The corner 110 includes a recess 112. In some embodiments, recess 112 may be formed in at least two of the walls 104 at the corner 110 of the vacuum package housing 103. As shown and further discussed herein, an aperture 111 may be disposed within the recess 112. As also shown, the recess 112 faces the external environment and is adapted to at least partially enclose a tip-off tube 118 while the tip-off tube 118 is connected to the vacuum package housing 103 at the aperture 111 to limit protrusion of the tip-off tube 118 (e.g., a residual portion of the tip-off tube 118) into the external environment while the tip-off tube 118 is in the closed state (e.g., sealed).

In some embodiments, recess 112 may be formed by removing material from walls 104 (e.g., by machining or otherwise). For example, material from the meeting of two of the walls 104 may be removed at the corner 110 to provide for the recess 112. In other embodiments, the recess 112 may be integrally formed with walls 104 and/or base 106.

In some embodiments, the recess 112 may be a flat recess at a 45 degree angle from the two walls 104 forming the corner 104, or may be constructed in another manner. The recess 112 is shown as recessed only within the walls 104 and not extended to the top or the bottom of the vacuum package housing 103 (e.g., to the base 106), however, in other embodiments, the recess 112 may be extended further.

Aperture 111 may be formed at corner 104 to provide a channel between the interior cavity 108 and an external environment around the vacuum package housing 103. In this regard, aperture 111 may extend through portions of the walls 104 exposed to recess 112. The aperture 111 may be used to attach a tip-off tube 118 having a tip-off tube cavity 114 allowing for flow-through of matter, such as gaseous matter in the interior cavity 108. The tip-off tube 118 may be used to create a vacuum within the interior cavity 108, as discussed herein. Thus, in a completed state as shown in FIG. 1, the aperture 111 is closed from the external environment using a pinch seal 116 applied to the tip-off tube 118 to maintain a vacuum within the interior cavity 108.

In order to form the vacuum package assembly 101 having the imaging components, vacuum package housing 103 further comprises an the focal plane array 120 disposed with the interior cavity 108. The focal plane array 120 may be configured to capture infrared image data. In this respect, the focal plane array 120 comprises, in one embodiment, one or more infrared sensors (e.g., any type of multi-pixel infrared detector, such as a focal plane array) for capturing infrared image data (e.g., still image data and/or video data) representative of an image, such as the thermal radiation 160 received from a scene to be imaged. The focal plane array 120 may be provided with the supporting electronics 130, such as a readout integrated circuit (ROIC). Thus, supporting electronics 130 may correspond to an integrated circuit designed to read detectors, such as those within the focal plane array 120.

Additionally, connecting pins 150 may extend through the base 106 of the vacuum package assembly 103 so that the connecting pins 150 join the supporting electronics 130 to additional electronics 140 (e.g., processing electronics). In some embodiments, the connecting pins 150 may be provided prior to placement of the focal plane array 120 and the supporting electronics 130 within the interior cavity 108, for example, by machining or otherwise providing the connecting pins 150 as vias through the base 108 to join the supporting electronics 130 to the additional electronics 140. In order to insulate the connecting pins 150 when necessary from the vacuum package housing 103, insulators 152 may be provided around the connecting pins 150, such as glass beads extended through the base 104 and surrounding the connecting pins 150. In some embodiments, one or more connecting pins 150 may be grounded to the vacuum package housing 103.

A window 102 may be disposed of on the open surface of the vacuum package housing 103 after the focal plane array 120 and the supporting electronics 130 are mounted within the vacuum package housing 103. The window 102 may be transmissive at least in the infrared wavelength, and may allow the infrared radiation 160 to pass. Thus, the focal plane array 120 may detect the infrared radiation 160 that passes through the window 102 in order to image an infrared scene.

Imager assembly 110 may further include additional electronics 140, which may correspond to processing electronics configured to receive, process, transmit, and/or record thermal image data received from the sensor assembly (e.g., the focal plane array 120). In one aspect, the infrared image data (e.g., infrared video data) may comprise non-uniform data (e.g., real image data) of an image, such as thermal radiation 160. The additional electronics 140 may be adapted to process the infrared image data (e.g., to provide processed image data), store the infrared image data in the memory component, and/or retrieve stored infrared image data from the memory component. Thus, the additional electronics 140 may be adapted to process infrared image data stored in the memory component and provide processed image data and information (e.g., captured and/or processed infrared image data).

In various embodiments, the additional electronics 140 comprises a processor, such as one or more of a microprocessor, a single-core processor, a multi-core processor, a microcontroller, a logic device (e.g., a programmable logic device (PLD) configured to perform processing functions), a digital signal processing (DSP) device, or other processing device. The additional electronics 140 may be adapted to interface and communicate with the focal plane array 120 and the supporting electronics 130 to perform method and processing steps and/or operations, as described herein. In one aspect, the additional electronics 140 may be adapted to perform various other image processes including noise reduction and scaling the infrared image data.

In order to further receive, process, and transmit infrared image data, the imaging assembly 100 may include other electronics and optics not shown. The electronics may be configured to provide additional processing of infrared image data, including adjustment of infrared imaging device temperature and capture temperature range (e.g., temperature and capture temperature of the imaging assembly 100), gain, resolution, and/or adjustment of the optics. The optics may be provided to the imaging assembly 100 in order to provide various optical abilities and/or options to the imaging assembly 100, including zoom, resolution, focus, or other optical function. The additional electronics 140 may access and manipulate the optics to provide various features to the imaging assembly 100. Processes, implemented, for example, by software instructions, may be accessed by the additional electronics 140 to provide such features.

It should be appreciated that various processes may be integrated in software and/or hardware as part of the additional electronics 140, with code (e.g., software or configuration data) stored, for example, in a memory component. Embodiments of the software and/or processes, as disclosed herein, may also be stored by a separate computer-readable medium (e.g., a memory, such as a hard drive, a compact disk, a digital video disk, or a flash memory) to be executed by a computer (e.g., a logic or processor-based system) to perform various methods and operations disclosed herein. In one aspect, the computer-readable medium may be portable and/or located separate from the imaging assembly 100, with the processes and software provided to the imaging assembly 100 by coupling the computer-readable medium to the imaging assembly 100 and/or by the imaging assembly 100 downloading (e.g., via a wired link and/or a wireless link) the processes and software from the computer-readable medium.

The memory component may comprise, in one embodiment, one or more memory devices adapted to store data and information, including infrared image data and information (e.g., metadata for the infrared image data). The memory component may comprise one or more various types of memory devices including volatile and non-volatile memory devices, such as RAM (Random Access Memory), ROM (Read-Only Memory), EEPROM (Electrically-Erasable Read-Only Memory), flash memory, or other storage device/mechanism. The additional electronics 140 may be adapted to execute software stored in the memory component so as to perform method and process steps and/or operations described herein. In various embodiments, components of the imaging assembly 100 may be combined and/or implemented or not, as desired or depending on the application or requirements, with the imaging assembly 100 representing various functional blocks of a related system. Furthermore, various components of the imaging assembly 100 may be remote from each other.

Figure 2:
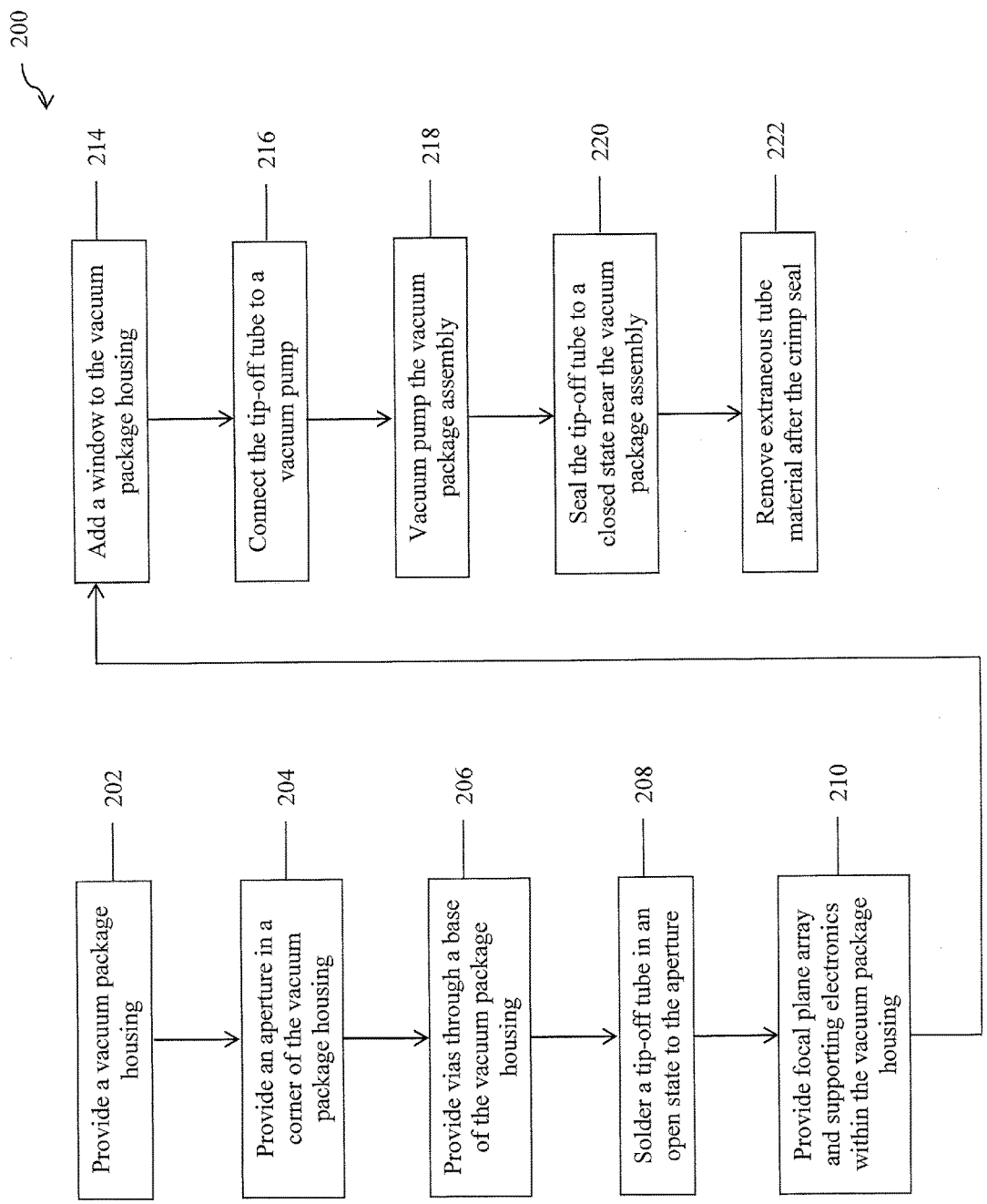
FIG. 2 illustrates a process flowchart for providing a vacuum package with a corner mounted tip-off tube, according to an embodiment.

FIG. 2 illustrates a process flowchart for providing a vacuum package with a corner mounted tip-off tube, according to an embodiment. In various embodiments, various steps, processes, and/or methods described herein may be omitted, performed in a different sequence, or combined as desired or appropriate.

At block 202, a vacuum package housing 103 is provided, which may be formed from a material to have a base 106 and walls 104 connected to the base. The vacuum package housing 103 may be formed of a single integrated structure, or may be formed from distinct structures connected to form one structure having a base 106 and walls 104 connected to the base 106. The vacuum package housing 103 may further include an interior cavity 108 defined by the walls 104. Additionally, the vacuum package housing 103 may be substantially rectangular or square, or other shapes. The vacuum package housing 103 may be formed from Kovar an iron-nickel-cobalt alloy or 304L stainless steel.

Figure 3A:
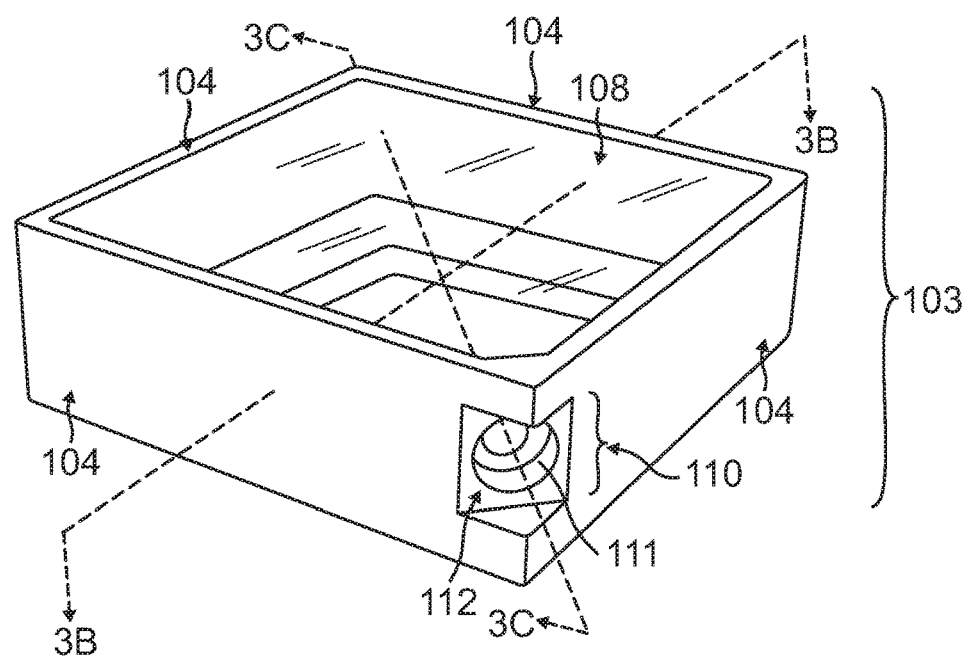
FIG. 3A illustrates an isometric view of vacuum package housing having an aperture in a corner prior to addition of a tip-off tube, according to an embodiment.
Figure 3B:
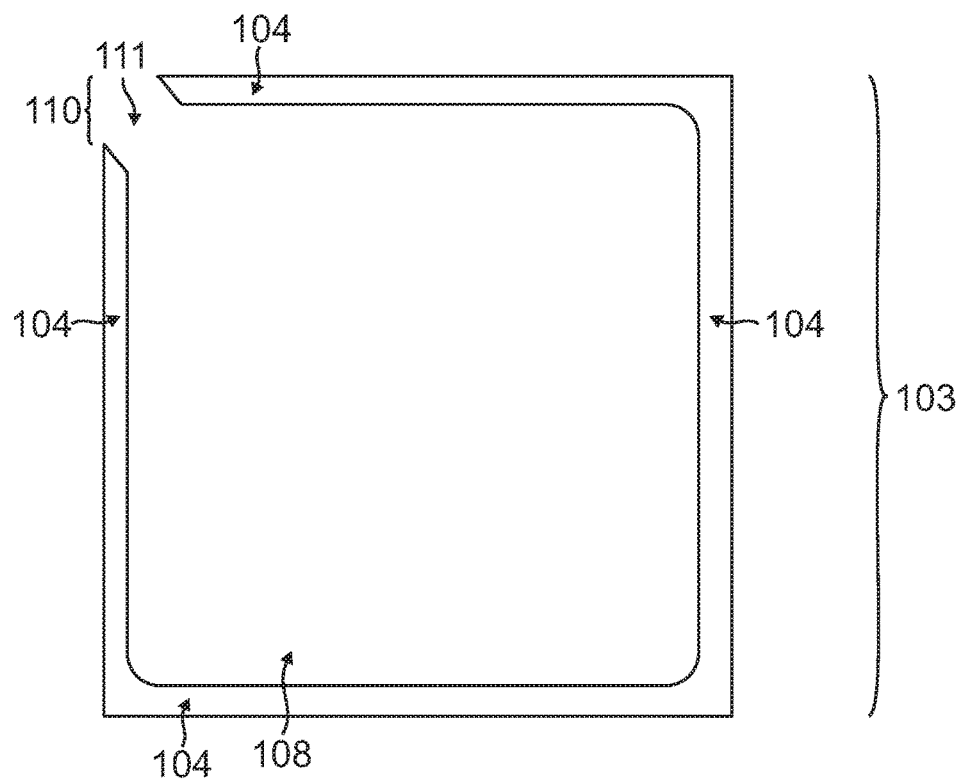
FIG. 3B illustrates a cross section of a vacuum package housing taken at line 3B-3B of FIG. 3A, according to an embodiment.
Figure 3C:
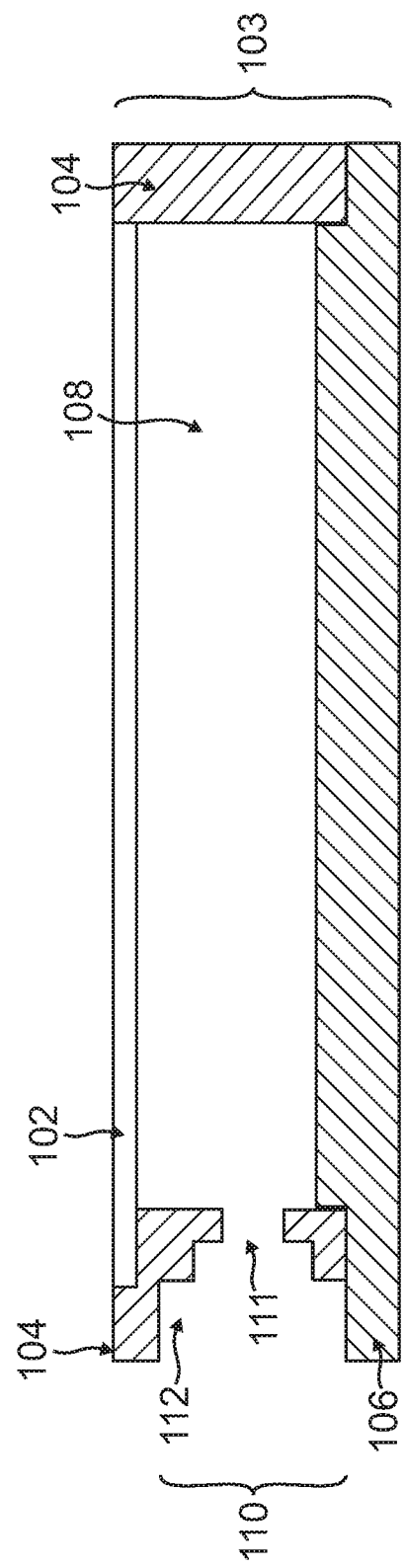
FIG. 3C illustrates a cross section of a vacuum package housing taken at line 3C-3C of FIG. 3A, according to an embodiment.

An aperture 111 is provided in a corner 110 of the vacuum package housing 103, at block 204. Referring to FIGS. 3A-3C, the aperture 111 is shown as provided in the corner 110. FIG. 3A illustrates an isometric view of a vacuum package housing having an aperture in a corner prior to addition of a tip-off tube, according to an embodiment. The walls 104 are shown forming a substantially square portion of the vacuum package housing 103 so that an interior cavity 108 is formed. The corner 110 is viewed where two of the walls 104 meet to form an intersection at a substantially 90 degree angle. The corner 110 therefore includes material from the meeting of two of the walls 104 such that the recess 112 may be formed. The recess 112 may be formed by extracting material from the corner 110, for example, by machining a recess that removes triangular section of material from the corner 110 between a top level and a bottom level of the walls 104. While the recess 112 does not extend to such a top and bottom level, other embodiments may extend the recess further along the height axis of the corner 110.

Using the recess 112, an aperture 111 may be formed that allows for a channel between the interior cavity 108 and an external environment, such as the environment surrounding the vacuum package housing 103. FIG. 3B illustrates a top down cutaway view of a vacuum package housing having an aperture in a corner prior to addition of a tip-off tube, according to an embodiment. In FIG. 3B, the aperture 111 may be seen as allowing a channel that allows matter to flow between the interior cavity 108. In FIG. 3B, the corner 110 is shown as the meeting of two of the walls 104, where the recess 112 may be formed by remove material including material allowing for the aperture 111 to be formed through the walls 104.

For example, FIG. 3C shows a vacuum package housing 103 having the recess 112 and the aperture 111. FIG. 3C illustrates a side cutaway view of a vacuum package housing having an aperture in a corner prior to addition of a tip-off tube, according to an embodiment. In this regard, FIG. 3C further shows that the recess 112 in the corner 110 still allows for material of the walls 104 at the top and bottom of the recess 112 and extending over and under the recess 112. The recess 112 allows for entry of a tip-off tube to connect to the aperture 111. Moreover, the recess 112 allows for placement and clearance of solder where the tip-off tube is soldered to the aperture 111. Additionally, a window 102 is shown on a surface opposite to the base 106. Thus, the vacuum package housing 103 further includes the window to demonstrate that the aperture allows for evacuation of matter (e.g., atmospheric gas) from the interior cavity 108.

At block 106, vias are provided through a base 106 of the vacuum package housing. The vias may correspond to the connecting pins 150 of FIG. 1, which may be insulated from the base 106 of the vacuum package housing 103 using insulators 152 also provided at block 106. The vias or connecting pins 150 may allow for connection of focal plane array 120 and/or supporting electronics 130 disposed within the interior cavity 108 of the vacuum package housing 103 with external electronics. Focal plane array 120 and supporting electronics 130 are omitted from FIGS. 3A-C, 4A-C, and 5A-C for clarity to better illustrate the features of vacuum package housing 103.

Figure 4A:
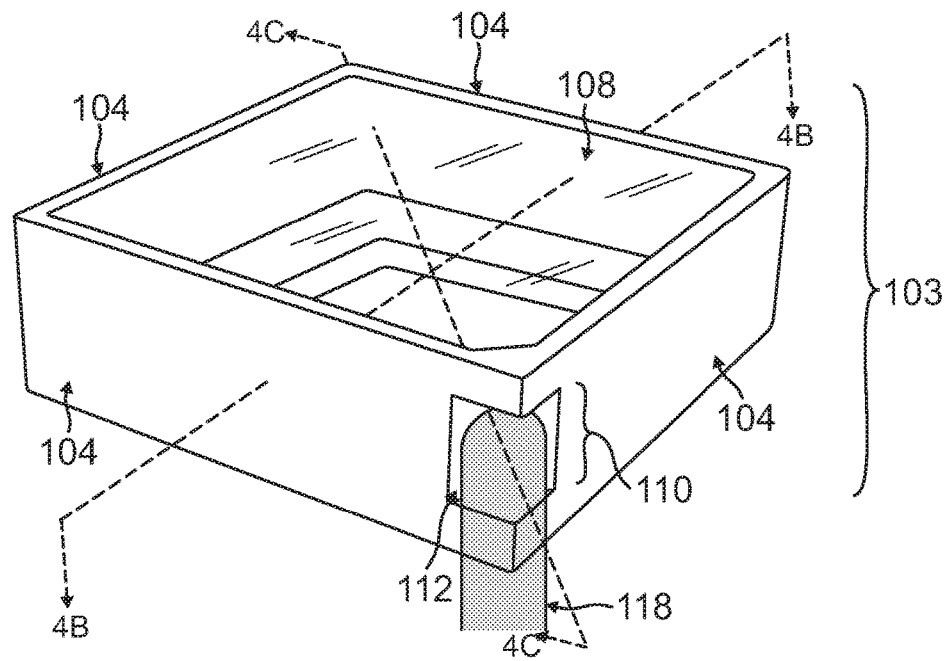
FIG. 4A illustrates an isometric view of a vacuum package housing having an open state tip-off tube connected to the aperture in the corner of the vacuum package housing, according to an embodiment.
Figure 4B:
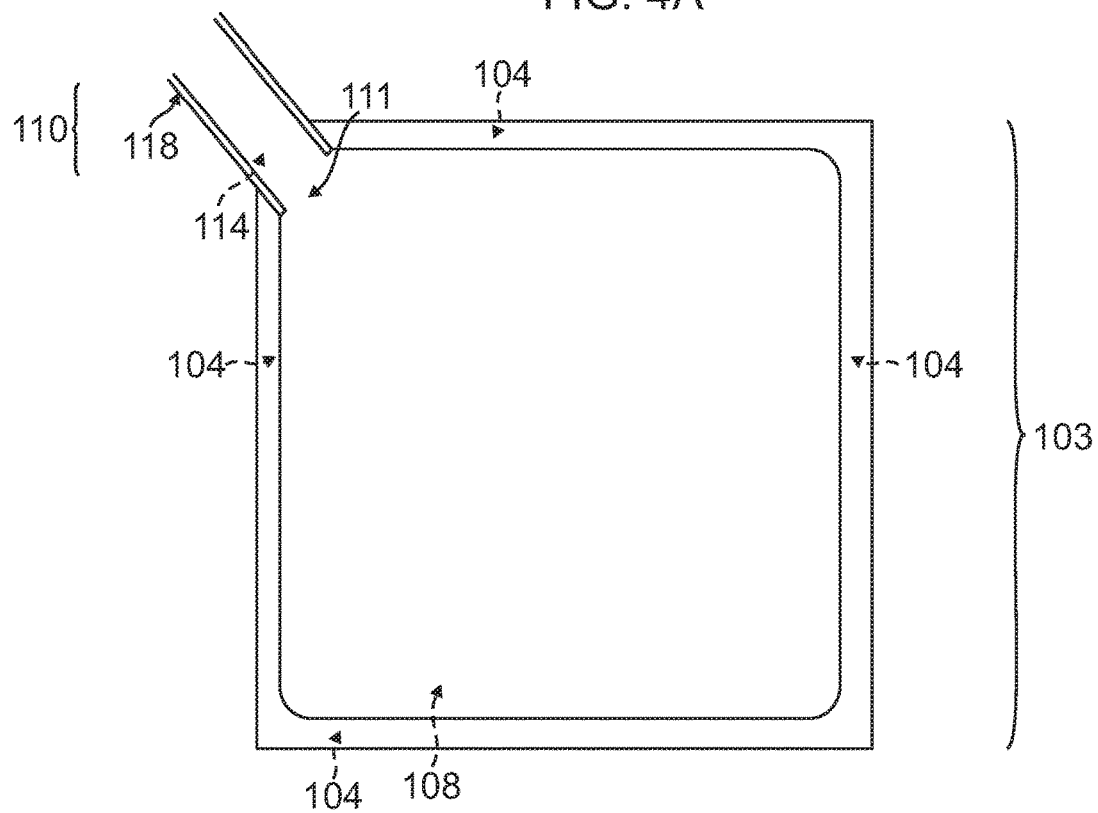
FIG. 4B illustrates a cross section of a vacuum package housing taken at line 4B-4B of FIG. 4A, according to an embodiment.
Figure 4C:
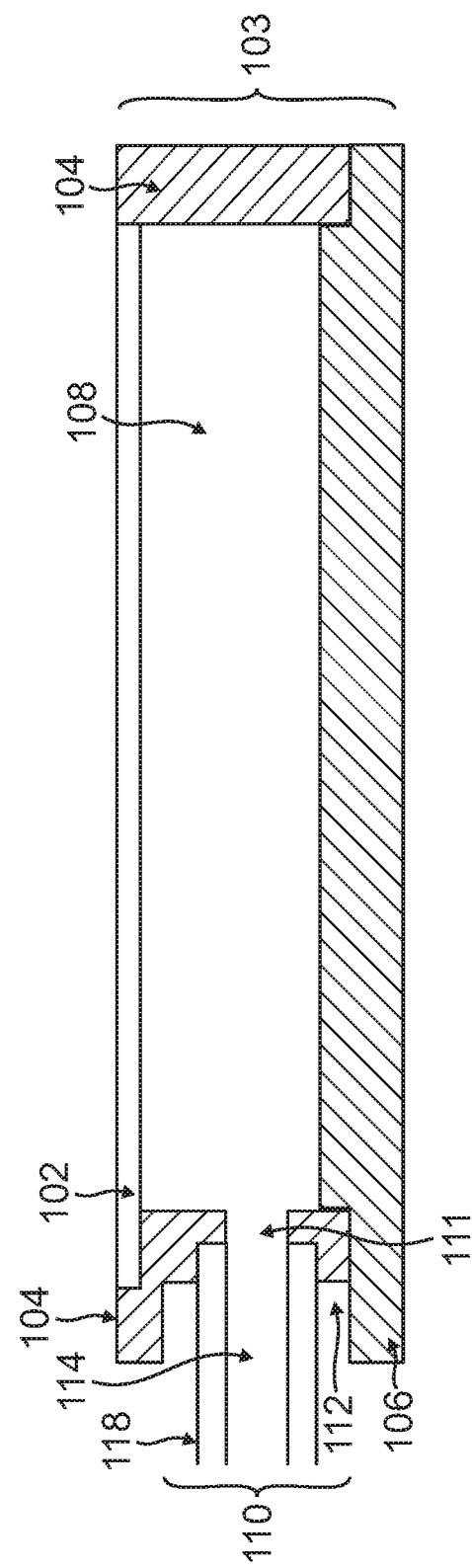
FIG. 4C illustrates a cross section of a vacuum package housing taken at line 4C-4C of FIG. 4A, according to an embodiment.

In order to provide a vacuum within a completed vacuum package assembly 101 formed from the vacuum package housing 103, a tip-off tube 118 in an open state is soldered to the aperture 111, at block 208. In this regard, FIGS. 4A-4C show a tip-off tube 118 connected to the vacuum package housing 103. FIG. 4A illustrates an isometric view of a vacuum package housing having an open state tip-off tube connected to the aperture in the corner of the vacuum package housing, according to an embodiment. For example, FIG. 4A includes the vacuum package housing 103 shown in FIG. 3A. However, in FIG. 4A the aperture 111 is obstructed by a tip-off tube 118 connected to the corner 110 and within the recess 112. The recess 112 allows room and clearance for the tip-off tube 118 to be attached to over the aperture 111. Thus, the aperture 111 now allows for flow of matter from the interior cavity 108 through the tip-off tube 118 to an external environment. The tip-off tube 118 is smaller in diameter than the height of the walls 104 to allow of a sealed (e.g., hermetically sealed) connection within the recess 112 and to the aperture 111. The tip-off tube 118 may be connected using a solder connection, or other type of sealed connected within the recess 112. The tip-off tube 118 may be constructed of a metal or other pliable material, such as copper.

In order to provide another perspective of the tip-off tube, FIG. 4B illustrates a top down cutaway view of a vacuum package housing having an open state tip-off tube connected to the aperture in the corner of the vacuum package housing, according to an embodiment. In FIG. 4B, the perspective of FIG. 3B is shown with the attached tip-off tube 118 to the aperture 111. The interior cavity 108 is shown as joined to the tip-off tube cavity 114 at the aperture 111. The tip-off tube 118 is in an open state, allowing for flow of matter (e.g., gaseous atmospheric matter within the interior cavity 108) through tip-off tube cavity 114.

In order to attach the window 102 so that the tip-off tube 118 forms the only channel between the interior cavity 108 and an external environment, the focal plane array 120 and supporting electronics 130 are added to the vacuum package housing 103 to form the vacuum package assembly 101. Thus, at block 210, a focal plane array 120 and supporting electronics 130 are provided within the vacuum package housing 103. For example, the focal plane array 120 and the supporting electronics 130 may be disposed in the interior cavity 108. The supporting electronics 130 may be connected to the connecting pins 150 (e.g., the vias) in order to allow for later mounting of the vacuum package assembly and communication of thermal image data.

At block 214, the window 102 is added to the vacuum package housing. For example, in FIG. 4C, the vacuum package housing 103 of FIG. 3C is shown with the tip-off tube 118 and the window 102 connected to the walls 104. FIG. 4C illustrates a side cutaway view of a vacuum package housing having an open state tip-off tube connected to the aperture in the corner of the vacuum package housing, according to an embodiment. As the vacuum package housing 103 is further shown with the window 102, matter may only enter or exit the interior cavity through the tip-off tube cavity 114 throughout the tip-off tube 118.

In FIG. 4C, the vacuum package housing 103 of FIG. 3C is shown with the tip-off tube 118 attached to the aperture 111 through the recess 112 formed at the corner 110. As shown in FIG. 4C, the recess 112 allows for clearance of the tip-off tube 118, as well as any additional matter, such as solder from a solder connection. For example and as previously discussed, the recess is formed to retain material at or nearby the base 106 and the window 102, and may form a type of pocket, cave, or inlet that allows for entry of the tip-off tube 118. Thus, part of the tip-off tube 118 may be obscured by the top and bottom extensions around the recess 112.

Once the window 102 is attached to the vacuum package housing 103, a vacuum package assembly 101 may be formed that includes a tip-off tube 118 in an open state. However, it may be desirable to maintain a vacuum around the focal plane array 120 and the supporting electronics 130 in the interior cavity 108. In order to provide a vacuum within the interior cavity 108, the tip-off tube 118 may be connected to a vacuum pump to substantially evacuate the interior cavity 108 and form the vacuum. Thus, at block 216, the tip-off tube 118 is connected to a vacuum pump so that at block 218, the vacuum package assembly 101 is vacuum pumped and matter is removed from the internal cavity 108 to form a vacuum around the focal plane array 120 and the supporting electronics 130 in the internal cavity 108.

Figure 5A:
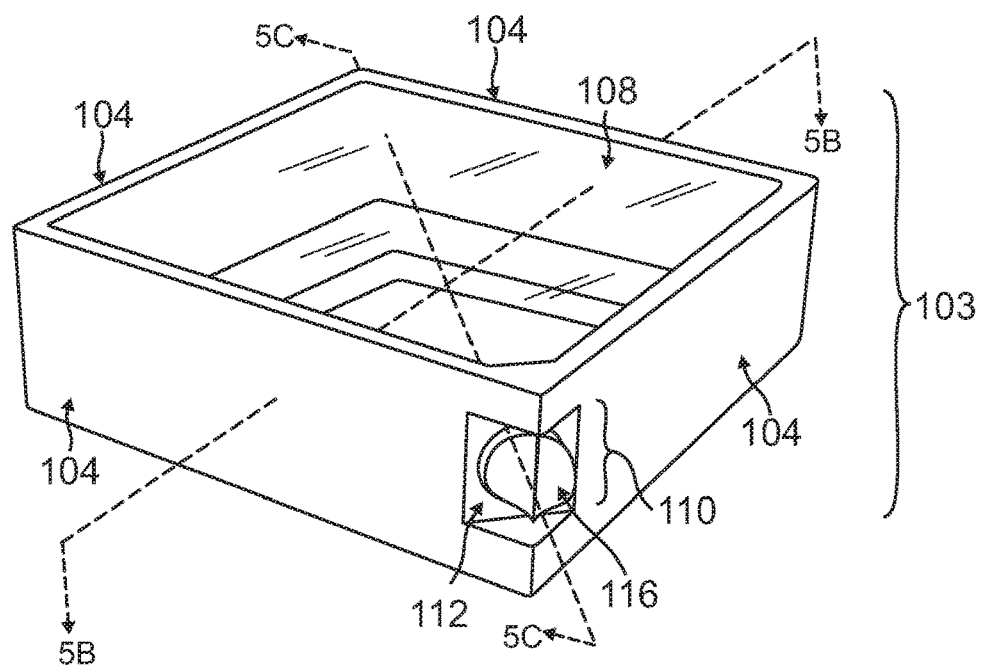
FIG. 5A illustrates an isometric view of a vacuum package housing having a closed state tip-off tube to maintain a vacuum in the interior compartment of the vacuum package housing, according to an embodiment.

Once the vacuum is formed, in order to maintain the vacuum, the tip-off tube 118 is changed to a closed state, at block 220, for example, by sealing the tip-off tube 118 near the vacuum package assembly 101. FIG. 5A shows a pinch seal 116 applied to the tip-off tube 118 to close the tip-off tube 118. FIG. 5A illustrates an isometric view of a vacuum package housing having a closed state tip-off tube to maintain a vacuum in the interior compartment of the vacuum package housing, according to an embodiment. The pinch seal 116 is shown within the recess 112 so that the pinch seal 116 is substantial contained within the recess 112 and does not or minimally extends from the corner 110 past the walls 104. The pinch seal may be formed by utilizing a machine roller or other mechanism to pinch seal the tip-off tube 118 by applying pressure to the pinch-off tube 118 on the external surface, such as through a cold weld (e.g., using the heat of the pressure process). The pinch seal may also be formed through another process the seals the tip-off tube 118 while maintain the vacuum in the interior cavity 108.

Figure 5B:
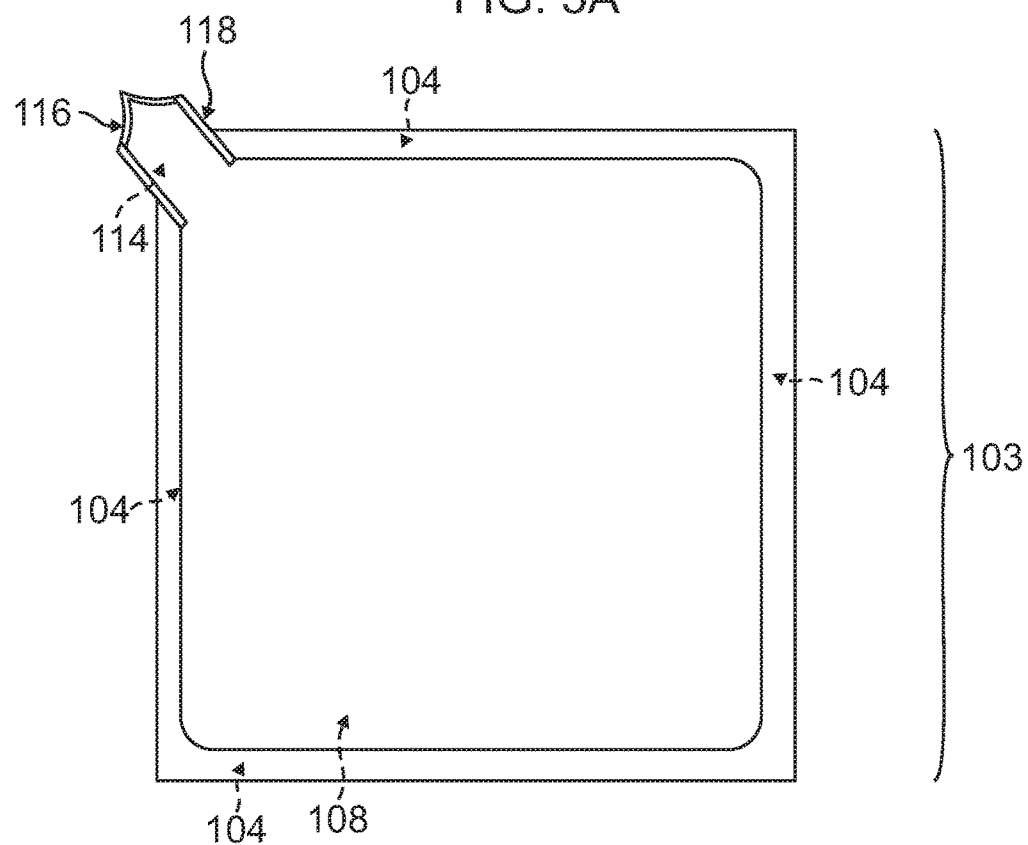
FIG. 5B illustrates a cross section of a vacuum package housing taken at line 5B-5B of FIG. 5A, according to an embodiment.

As previously discussed, the recess 112 includes an inlet formed within corner 110 so that a top and bottom portion of the walls 104 at the corner 110 are still extended above and below the recess 112. FIG. 5B illustrates a top down cutaway view of a vacuum package housing having a closed state tip-off tube to maintain a vacuum in the interior compartment of the vacuum package housing, according to an embodiment. In FIG. 5B, the tip-off tube 118 is shown as shortened after a pinch or crimp mechanism is applied to form the pinch seal 116. A tip-off tube cavity 114 is shortened by the pinch seal 116 and no longer extends from the interior cavity 108 to an external environment. Thus, the walls 104, window 102, and the tip-off tube 118 with the pinch seal 116 now form a continuous structure with no openings to an external environment from the interior cavity 108.

Figure 5C:
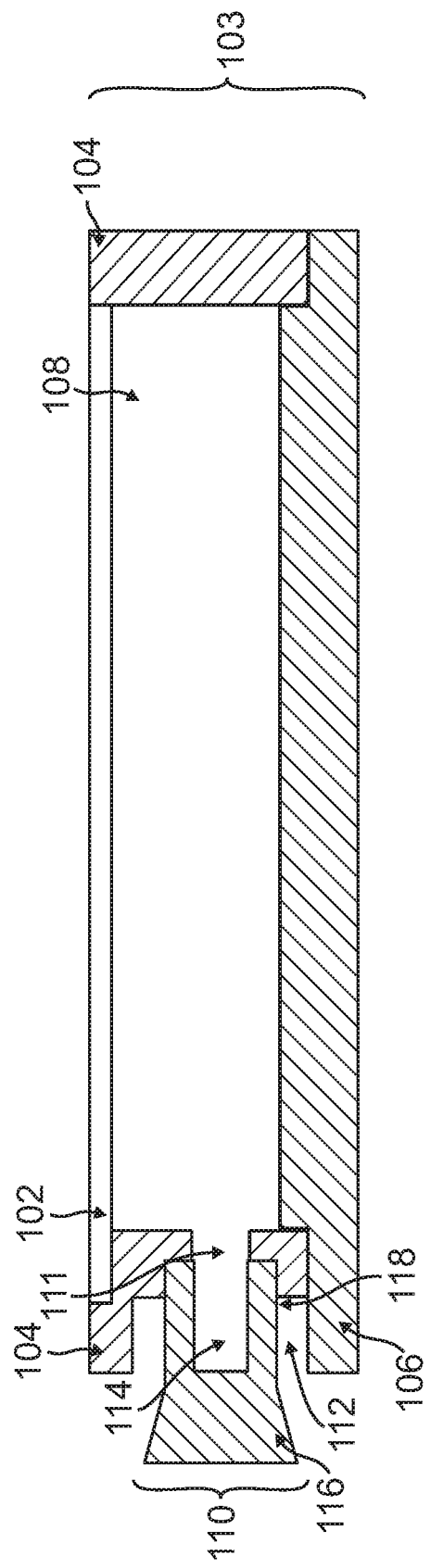
FIG. 5C illustrates a cross section of a vacuum package housing taken at line 5C-5C of FIG. 5A, according to an embodiment.

The tip-off tube 118 and the pinch seal 116 may be maintained substantially within the walls 104 and the corner 110. FIG. 5C illustrates a side cutaway view of a vacuum package housing having a closed state tip-off tube to maintain a vacuum in the interior compartment of the vacuum package housing, according to an embodiment. The top and bottom extensions allow for coverage of the remainder of the tip-off tube 118 with the pinch seal 116 as shown in FIG. 5c. Thus, the pinch seal 116 is substantially covered within the recess 112 and does not extend substantially beyond the overall perimeter of the vacuum package housing 103, thus permitting other external components to be positioned and/or mounted in close proximity to vacuum package housing 103.

The tip-off tube 118 is further shown as forming a seal for the interior cavity 108 using the pinch seal 116 so that the tip-off tube cavity 114 forms part of the interior cavity 108. Thus, FIG. 5C shows a substantially similar to FIG. 1 without the interior detectors and electronics and the back end processing electronics.

Where applicable, various embodiments provided by the present disclosure can be implemented using hardware, software, or combinations of hardware and software. For example, the various operations described herein may be performed by various combinations of hardware, software (e.g., hardware controlled by appropriate software running on a controller or otherwise), and/or manual human activity. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A device comprising:
    a vacuum package housing comprising:
        a base;

a plurality of walls connected to the base and defining an interior cavity adapted to receive a focal plane array, wherein at least two of the walls meet to define a corner of the vacuum package housing;

a recess formed in the at least two walls at the corner;

an aperture formed at the corner and disposed within the recess, wherein the aperture extends through the at least two of the walls to provide a channel between the interior cavity of the vacuum package and an external environment, and wherein the aperture is adapted to receive a tip-off tube adapted to be changed from an open state to a closed state to maintain a vacuum within the interior cavity; and wherein the recess is adapted to at least partially enclose the tip-off tube to limit protrusion of the tip-off tube into the external environment while the tip-off tube is in the closed state.

2. The device of claim 1, further comprising the tip-off tube connected to the vacuum package housing at the aperture.

3. The device of claim 2, wherein the tip-off tube is in the open state and is adapted to be connected to a vacuum pump to substantially evacuate the interior cavity of the vacuum package housing.

4. The device of claim 3, further comprising the vacuum pump connected to the tip-off tube.

5. The device of claim 2, wherein the tip-off tube is in the closed state.

6. The device of claim 1, further comprising the tip-off tube in the closed state and connected to the vacuum package housing at the aperture.

7. The device of claim 1, wherein the vacuum package housing is substantially rectangular, and wherein the base and the walls are one integrated structure.

8. The device of claim 1, further comprising:
the focal plane array disposed in the interior cavity of the vacuum package housing;
supporting electronics disposed in the interior cavity of the vacuum package housing with the focal plane array, wherein the supporting electronics comprise a read out integrated circuit; and
a plurality of connecting pins extended from the interior cavity of the vacuum package through the base, wherein the connecting pins are adapted to connect the supporting electronics to external additional electronics.

9. The device of claim 8, further comprising:
a window connected to the plurality of walls;
wherein the window is adapted to pass infrared radiation from a scene in the external environment; and
wherein the focal plane array is adapted to receive the infrared radiation.

10. A thermal camera comprising the device of claim 9.

11. A method of operating the device of claim 9, the method comprising capturing a thermal image by the focal plane array.

12. A method of sealing the device of claim 1, the method comprising:
providing the base and the walls of the vacuum package housing;
forming the aperture at the corner of the vacuum package housing;
soldering the tip-off tube to the vacuum package housing at the aperture while the tip-off tube is in the open state;
connecting the tip-off tube to a vacuum pump;
evacuating the interior of the vacuum package through the tip-off tube using the vacuum pump; and
changing the tip-off tube to the closed state to maintain a vacuum within the interior cavity.

13. The device of claim 1, wherein portions of the walls defining the corner extend above and below the recess toward the external environment.

14. A method comprising:
providing a vacuum package housing comprising a base and a plurality of walls connected to the base, wherein the base and the walls define an interior cavity adapted to receive a focal plane array, and wherein at least two of the walls meet to define a corner of the vacuum package housing;
forming a recess formed in the at least two walls at the corner;
forming an aperture at the corner of the vacuum package housing and disposed within the recess, wherein the aperture extends through the at least two of the walls to provide a channel between the interior cavity of the vacuum package and an external environment, and wherein the aperture is adapted to receive a tip-off tube adapted to be changed from an open state to a closed state to maintain a vacuum within the interior cavity; and
wherein the recess is adapted to at least partially enclose the tip-off tube to limit protrusion of the tip-off tube into the external environment while the tip-off tube is in the closed state.

15. The method of claim 14, further comprising connecting the tip-off tube to the vacuum package housing at the aperture.

16. The method of claim 15, further comprising:
connecting the tip-off tube to the vacuum pump; and
operating the vacuum pump while the tip-off tube is in the open state to substantially evacuate the interior cavity of the vacuum package housing.

17. The method of claim 16, further comprising sealing the tip-off tube to change the tip-off tube to the closed state.

18. The method of claim 14, further comprising:
providing the focal plane array in the interior cavity of the vacuum package housing;
providing supporting electronics in the interior cavity of the vacuum package housing with the focal plane array, wherein the supporting electronics comprise a read out integrated circuit; and
providing a plurality of connecting pins extended from the interior cavity of the vacuum package through the base, wherein the connecting pins are adapted to connect the supporting electronics to external additional electronics.

19. The method of claim 18, further comprising:
connecting a window to the plurality of walls, wherein the window is adapted to pass infrared radiation from a scene in the external environment, and wherein the focal plane array is adapted to receive the infrared radiation.

20. The method of claim 14, wherein portions of the walls defining the corner extend above and below the recess toward the external environment.

* * * * *